United States Patent [19]
Bromley et al.

[11] Patent Number: 5,487,956
[45] Date of Patent: Jan. 30, 1996

[54] ADAPTIVE BACKUP BATTERY MANAGEMENT FOR VEHICULAR BASED ELECTRONIC MODULES

[76] Inventors: Steven D. Bromley, 9804 Woodshire Dr., Austin, Tex. 78748; James F. Herrmann, 112 Cedar Dr., Buda, Tex. 78610; Mark V. Emery, 6115 Oliver Loving Trail, Austin, Tex. 78749

[21] Appl. No.: 308,014

[22] Filed: Sep. 16, 1994

[51] Int. Cl.$^6$ .............................................. H01M 10/48
[52] U.S. Cl. ................... 429/90; 320/2; 429/92
[58] Field of Search .............................. 429/90–93, 122, 429/61; 320/2, 30, 43, 48, 49; 340/636

[56] References Cited

U.S. PATENT DOCUMENTS

| | | | |
|---|---|---|---|
| 5,057,383 | 10/1991 | Sokira | 429/92 |
| 5,156,928 | 10/1992 | Takabayashi | 429/61 X |
| 5,372,898 | 12/1994 | Atwater et al. | 429/90 |

*Primary Examiner*—Anthony Skapars

[57] ABSTRACT

A backup battery management method (200), and corresponding apparatus (101) monitors a system voltage (111) and charges a backup battery (109) while a short-term average (405) of the system voltage exceeds a long-term average (407) of the system voltage.

9 Claims, 5 Drawing Sheets

FIG. 3A

| | PARAMETER | TYPE | DESCRIPTION | UNITS | DEFAULT VALUE |
|---|---|---|---|---|---|
| 319 | BACK_CKT_L | Programmable Constant | Voltage loss in the current path 123 when running off the backup battery 105. Loss includes the combined voltage drop in electronically controlled switch 124 and steering diode 127 or equivalent | volts | 0.51 |
| 307 | CAR_ON_MIN | Programmable Constant | Minimum node voltage at reference 114 to guaranty the charging system 107 is charging | volts | 13.31 |
| | CHG_CKT_LOSS | Programmable Constant | Voltage loss in the current path 117. Includes combined voltage drop in polarity protection and steering diode 119 and voltage drop across current limited switch 121 or equivalent. | volts | 0.51 |
| | HYST_CHG | Programmable Constant | Hysteresis voltage to prevent oscillation between the state CHARGE BACKUP BATTERY 202 and the state RUN OFF VEHICLE BATTERY 201 | volts | 0.25 |
| 323 | HYST_RUN | Programmable Constant | Hysteresis voltage to prevent oscillation between the state RUN OFF BACKUP BATTERY 203 and the state RUN OFF VEHICLE BATTERY 201 | volts | 0.25 |
| 329 | OFF2ON_DELTA | Programmable Constant | Minimum expected difference in voltage at node reference 114 (the primary battery 103/the charging system 107) between the charging system 107 charging and not charging. | volts | 0.51 |
| 321 | V_BACK_MIN | Programmable Constant | Minimum viable value for the voltage of the backup battery 105 to power the security module 101. | volts | 8.03 |
| 327 | V_CHG_MIN | Programmable Constant | Minimum expected terminal voltage on the backup battery 105 after applying charging current for time MIN_CHG_TEST_TIME 307. | volts | 4.97 |
| 331 | V_SYS_MAX | Programmable Constant | Maximum value of node voltage at reference 114 (the primary battery 103/the charging system 107) to safely charge the backup battery 105. | volts | 15.48 |
| 315 | V_SYS_MIN | Programmable Constant | Minimum voltage value at node reference 114 (the primary battery 103/the charging system 107) for viable use of the primary battery 103 or charging system 107 to power the security module 101. | volts | 10.00 |
| 325 | MIN_CHG_TEST_TIME | Programmable Constant | Amount of time to apply initial charging current before deciding whether or not the backup battery 105 is shorted or damaged. | seconds | 30 |
| 333 | BAD_CHARGE_DELAY | Programmable Constant | How much time to wait before another charge attempt is made after a damaged or shorted backup battery 105 has been detected. | seconds | 43,200 |
| 317 | V_BACK | Variable | Short-term averaged voltage of the backup battery 105, accounting for input scaling network 145. Preferably this value is updated once each 10 mS, using an averaging method with a 1-second time constant as described in FIG. 4. | volts | NA |

FIG. 3B

| | | | | |
|---|---|---|---|---|
| V_SYS_AVG | Variable | Long-term averaged voltage of the node reference 114, accounting for input scaling network 139. Preferably this value is updated using an averaging method with a 12 hour time constant as described in FIG. 4. | volts | NA |
| TIMEOUT | Constant | A fixed value representing a timeout condition for any timer. In the timeout condition a timer has zero seconds left to count. | seconds | 0 |
| BAD_CHG_TI | Variable | A variable used to time bad charge events. Timer variables continue to count down once per second until they reach the value zero, which is considered a TIMEOUT 303. | seconds | NA |
| USE_BACKUP | control signal | A control signal USE_BACKUP 135 generated by microcomputer 109 controlling usage of the backup battery 105 to power the security module 101. True if the backup battery 105 is to power the security module 101, false if it is not. | TRUE / FALSE | FALSE |
| CHARGE_CTL | control signal | A control signal CHARGE_CTL 122 generated by microcomputer 109 controlling charging of the backup battery 105. True if the backup battery 105 is to be charged, false if not. | TRUE / FALSE | FALSE |

ADAPTIVE BACKUP BATTERY MANAGEMENT FOR VEHICULAR BASED ELECTRONIC MODULES

FIELD OF THE INVENTION

This invention is generally directed to the field of battery management, preferably in a vehicular application.

BACKGROUND OF THE INVENTION

In a vehicular application an anti-theft or security system's main operative power is ordinarily drawn from a vehicle battery and, when operative, the vehicle's associated charging system. To insure security system operation when the main operative power is not available from either the vehicle battery or charging system, a backup battery is typically used. Thus, the backup or reserve battery powers the security system when main operative power is turned off, or cut off.

To insure maximum operating time for the security system, the backup battery is typically a secondary or rechargeable type battery. Optimally, the backup battery will only be charged when the vehicle's charging system is active—so as not to unnecessarily deplete the vehicle battery for the purpose of replenishing the backup battery. Also, in accordance with achieving maximum operating time, the backup battery should only power the security system while the vehicle's charging system and vehicle battery are incapable of doing so.

In a security system it is also vital to minimize the physical evidence of interconnections between the vehicle's electrical system and the security system. This is important to help hide the security system from a thief who may attempt to disable the security system to acquire the vehicle. Optimally, the security system will have minimal external connections, and where external connections are necessary they are preferably localized proximate the security system so that they are easily concealed and not exposed to the thief.

In addition to an electrical connection for providing operative power to the security system from the vehicle battery, prior art schemes have required an additional ignition keyswitch input to determine whether or not the vehicle's charging system is active—and thus when to charge the backup battery. This is not desirable because of the additional wiring exposed to the thief. Furthermore the additional wiring is undesirable because of added manufacturing cost, installation difficulty, and field reliability concerns.

Another requirement in a backup battery management scheme is that the backup battery should not be charged from a voltage source higher than a safe magnitude. If charging is allowed from a voltage source higher than a safe magnitude, then the backup battery may become damaged. Furthermore, if a backup battery is shorted, a backup battery apparatus associated with the prior art backup battery management scheme can be damaged because of excess power dissipation.

What is needed is an improved backup battery management approach that has minimal external electrical interconnections localized where possible, efficiently replenishes a backup battery only while an associated charging system is actively charging a vehicle battery, uses the backup battery to power a security system only while a vehicle's charging system and vehicle battery are incapable of doing so, and limits charging of the backup battery while the charging system is outputting too high a voltage or the backup battery is electrically shorted.

BRIEF DESCRIPTION OF THE DRAWINGS

FIG. 3 is a chart illustrating variable and constant definitions corresponding to variables and constants found in the state diagram of FIG. 2;

DETAILED DESCRIPTION OF A PREFERRED EMBODIMENT

A backup battery management method, and corresponding apparatus, monitors a system voltage provided by a charging system, and charges a backup battery while a short-term average of the system voltage exceeds a long-term average of the system voltage. The approach detailed in the preferred embodiment has minimal external electrical interconnections because a separate electrical connection to an ignition switch is not used to determine whether or not the charging system is providing operative power. Furthermore, the improved backup battery management approach efficiently replenishes a backup battery only while the charging system is actively charging a vehicle battery, uses the backup battery to power a security system only while a vehicle's charging system and vehicle battery are incapable of doing so, and limits charging of the backup battery while the charging system is outputting too high a voltage or the backup battery is electrically shorted. To understand how these benefits are achieved by the improved approach several figures are introduced next.

Figure 1:
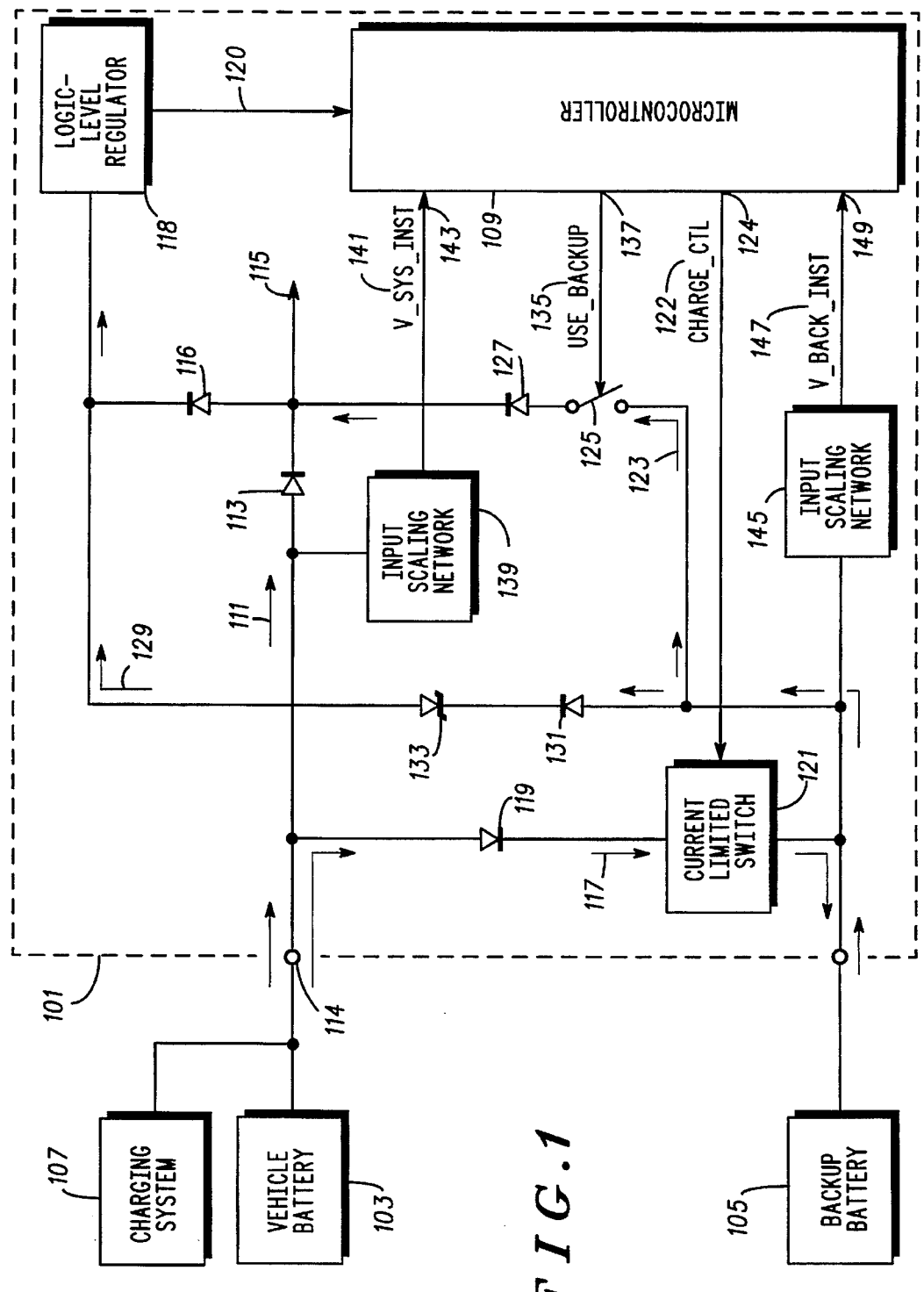
FIG. 1 is a schematic diagram of an apparatus in accordance with a preferred embodiment of the invention.

FIG. 1 is a schematic diagram of an apparatus in accordance with a preferred embodiment of the invention. A security, or anti-theft, module 101 is mounted in a vehicle concealed from view. External connections include connection to a vehicle battery 103, that is connected in parallel with a charging system 107. The charging system 107 includes an alternator and a regulator. The charging system 107 is used to replenish both the vehicle battery 103 and a backup battery 105. The backup battery 105 is positioned proximate the security module 101, in harmony with the desire to localize external electrical connections. Since there is only one connection over an appreciable distance, between security module 101 and the combination of the vehicle battery 103 and the charging system 107, the external electrical interconnections are minimized and isolated. This is important in a security system so that the security module 101 is difficult to tamper with.

The security module 101 has an embedded microcontroller 109. Preferably, this is a Motorola MC68HC11A8 microcontroller. This Motorola microcontroller 109 includes on-board program memory for encoding operating software described in state diagram and flow chaff forms later, and also analog input and digital output capabilities which are used in this application. The microcontroller 109 controls the routing of signals associated with the deployment of operative power, or energy, from the vehicle battery 103 and charging system 107 to power the security module 101 and also to charge the backup battery 105. Furthermore, the microcontroller 109 controls the routing of power from the backup battery 105 to the security module 101.

The charging system 107, and/or the vehicle battery 103, provides operative power to the security module 101 via an interconnection shown at a reference number 114. Either of these devices 103 or 107 powers the security module 101 via a current path 111, through a steering diode 113, to a module power terminal 115. A steering diode 116 provides a path for operative power from the module power terminal 115 to a logic level regulator 118. The logic level regulator 118 provides a regulated logic operating voltage 120 for the microcontroller 109 and other logic level circuits located within the security module 101.

The charging system 107, which drives the vehicle battery 103, can provide charging current to the backup battery 105 via a current path 117. If the microcontroller 109 determines that the charging system 107 is active, then the backup battery charging current is provided through a steering and polarity protection diode 119 and a current limited switch 121. The microcontroller 109 can interpret whether or not the charging system 107 is active via an input scaling network 139 read through an analog input port 143. The current limited switch 121 is controlled by a control signal CHARGE_CTL 122 generated from a digital output port 124 of the microcontroller 109. The current limited switch 121 is in place to insure that the charging current provided to the backup battery 105 is limited to prevent damage to the backup battery 105. For instance excessive current could be demanded by the backup battery if it is supplied by high a voltage from the charging system 107, or the backup battery 105 is electrically shorted. Preferably, the charging current is limited to 70 mA. The current limited switch 121 can be built with known circuit techniques using a active-mode transistor and diode reference voltage.

Under certain conditions the backup battery 105 can also provide operative power to the security module 101. If the charging system 107 and the vehicle battery 103 do not have sufficient terminal voltage to power the security module 101, but the backup battery 105 does have sufficient terminal voltage, then the backup battery 105 supplies the security module 101 with operative power via the current path 123, through an electronically controlled switch 125, and also through a steering diode 127, under the control of the microcontroller 109. Specifically, the electronically controlled switch 125 is controlled by the microcontroller 109 via a control signal USE_BACKUP 135, provided from a digital output port 137 of the microcontroller 109.

As mentioned above, in the absence of sufficient terminal voltage from both the charging system 107 and the vehicle battery 103, the backup battery 105 provides operative power to the logic level regulator 118 via a current path 129. Operative power is provided via a current sneak path 129 between the backup battery 105 and the logic-level regulator 118 via a steering diode 131 and a zener diode 133. Provision of the current sneak path 129 is necessary so that the microcontroller 109 is correctly powered-up in the absence of sufficient terminal voltage from both the charging system 107 and the vehicle battery 103. Once powered-up the microcontroller 109 can activate the electronically controlled switch 125 to route operative power from the backup battery 105 to the module power terminal 115 via the current path 123. In the default power-up state, experienced as the microcontroller 109 comes out of reset, the control signal USE_BACKUP 135 generated from a digital output port 137 of the microcontroller 109 is inactive causing the electronically controlled switch 125 to be held open. Without the current sneak path 129, the security module 101 would be inoperative because the microcontroller 109 would not be provided with power by the logic operating voltage 120.

The value of the zener diode 133 is chosen so that under conditions where the charging system 107 or the vehicle battery 103 provide sufficient terminal voltage to power the security module 101 no current will drain from the backup battery 105 because the breakdown voltage of the zener diode 133 will not be achieved. The steering diode 131 insures that no undesired charging current flows into the backup battery 105 in the reverse direction along the current path 129.

An instantaneous terminal voltage provided by the charging system 107 and the vehicle battery 103 at the reference node 114 is processed by the input scaling network 139. The input scaling network 139 provides a scaled analog signal V_SYS_INST 141 to the analog input port 143 of the microcontroller 109. The scaled analog signal V_SYS_INST 141 is a representation of the instantaneous voltage present at the reference node 114. The microcontroller 109 processes the scaled analog signal V_SYS_INST 141 as shown later in FIG. 4.

An instantaneous terminal voltage provided by the backup battery 105 is processed by an input scaling network 145. The input scaling network 145 provides a scaled analog signal V_BACK_INST 147 to an analog input port 149 of the microcontroller 109. The scaled analog signal V_BACK_INST 147 is a representation of the instantaneous terminal voltage present at the backup battery 105. The microcontroller 109 processes the scaled analog signal V_BACK_INST 147 as shown later in FIG. 4.

The current limited switch 121, controlled by signal CHARGE_CTL 122 generated by microcontroller 109, allows selective application of a charging current, via the current path 117, to the backup battery 105. If the microcontroller 109 determines that the voltage at the reference node 114 is too large, preferably equal to or greater than 15.5 volts, the microcontroller 109 will open the current limited switch 121. This feature solves the problem of charging at too high a supply voltage—which could damage the backup battery 105. When the voltage at reference node 114 is in a safe range to charge backup battery 105, and it meet all other conditions per the state diagram in FIG. 2, the current limited switch 121 will be enabled. Furthermore, if during charging of the backup battery 105 with the current limited switch 121 the microcontroller 109 determines that the backup battery 105 is electrically short circuited, then the microcontroller 109 will abort the charging process by opening the current limited switch 121. The microcontroller can determine an electrical short condition by monitoring the terminal voltage at the backup battery 105. If the terminal voltage is below a minimum charge voltage for a period of time, then the backup battery 105 is considered electrically shorted. This technique is applied because in a properly operating battery the terminal voltage will rise as a charge is being accepted. Preferably, the minimum charge voltage is 4.97 volts and the period of time is 30 seconds. If the microcontroller 109 aborts charging due to an electrically shorted battery, the microcontroller 109 will wait for 43,200 seconds before attempting to charge the backup battery 105 again. This feature solves the problem of charging a shorted backup battery—which could damage the charging electronics in the security module 101.

Figure 2:
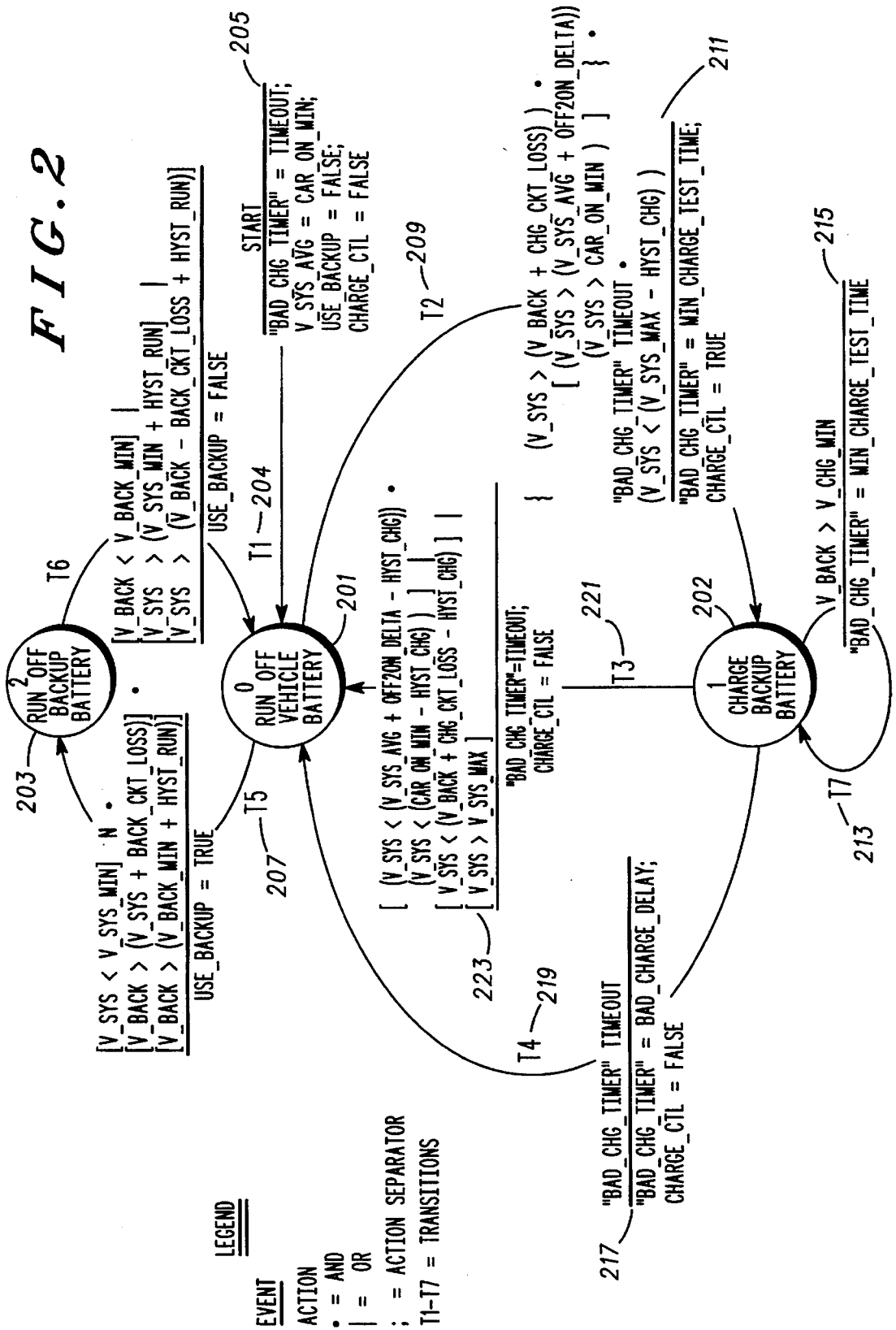
FIG. 2 is a state diagram encoded into the apparatus shown in FIG. 1.

FIG. 2 is a state diagram encoded as software steps into the apparatus shown in FIG. 1. The variables, constants, and control signal definitions used in FIG. 2 are defined and described in detail in FIG. 3. Both FIG. 2 and FIG. 3 will be referenced in the following section.

When the security module 101 is initially powered on, it enters a state RUN OFF VEHICLE BATTERY 201 via a state transition T1 204. As the security module 101 transitions to the state RUN OFF VEHICLE BATTERY 201 the microcontroller 109 performs several actions as defined in a state transition event/action 205. The microcontroller 109 initializes a variable BAD_CHG_TIMER 301 to a constant value TIMEOUT 303. The constant value of TIMEOUT 303 is preferably zero. Also, in the state transition event/action 205 a variable V_SYS_AVG 305 is initialized to a constant value CAR_ON_MIN 307. The constant value of CAR_ON_MIN 307 is preferably 13.31 volts. Further, in the state transition event/action 205 the control signal USE_BACKUP 309/135 and the control signal CHARGE_CTL 311/122 are initialized to FALSE.

While the security module 101 is in the state RUN OFF VEHICLE BATTERY 201 the microcontroller 109 evaluates the variables described in FIG. 3 to determine if it should stay in the state RUN OFF VEHICLE BATTERY 201 or cause the security module 101 to transition to either a state RUN OFF BACKUP BATTERY 203 or a state CHARGE BACKUP BATTERY 202.

A state transition T5 207 facilitates the change of state of the security module 101 from the state RUN OFF VEHICLE BATTERY 201 to the state RUN OFF BACKUP BATTERY 203. The state transition T5 207 occurs when the security module 101 is in the state RUN OFF VEHICLE BATTERY 201 and the microcontroller 109 observes that a variable V_SYS 313 is less than a constant V_SYS_MIN 315, preferably 10.0 volts, that a variable V_BACK 317 is greater than the sum of the variable V_SYS 313 and a constant BACK_CKT_LOSS 319, preferably 0.51 volts, and furthermore that the variable V_BACK 317 is greater than the sum of a constant V_BACK_MIN 321, preferably 8.0 volts, and a constant HYST_RUN 323, preferably 0.25 volts. During the transition the microcontroller 109 sets the control signal USE_BACKUP 135/309 to the TRUE state, thereby closing electronically controlled switch 125 and permitting the backup battery 105 to supply power to the module power terminal 115 through current path 123.

A state transition T2 209 facilitates the change of state of the security module 101 from the state RUN OFF VEHICLE BATTERY 201 to the state CHARGE BACKUP BATTERY 202. The state transition T2 209 occurs when the security module 101 is in the state RUN OFF VEHICLE BATTERY 201 and the microcontroller 109 observes conditions which result in the event section of a state transition event/action 211 evaluating to a logical positive. During the state transition T2 209 the microcontroller 109 performs the actions described in the action section of the state transition event/action 211. In particular the microcontroller 109 sets the control signal CHARGE_CTL 122/311 to the TRUE state, thereby closing current limited switch 121 and permitting the backup battery 105 be charged with current via current path 117. Also during state transition T2 209 the microcontroller 109 sets the variable BAD_CHG_TIMER 301 to a value MIN_CHARGE_TEST_TIME 325, preferably 30 seconds. After the state transition T2 209 is complete the security module 101 is in the state CHARGE BACKUP BATTERY 202.

While the security module 101 is in the state CHARGE_BACKUP BATTERY 202 the microcontroller repetitively follows a state transition T7 213. The state transition T7 213 flows from the state CHARGE_BACKUP BATTERY 202 to the same state CHARGE_BACKUP BATTERY 202. During the state transition T7 213 the microcontroller 109 evaluates the event portion of a state transition event/action 215. If the event portion of the state transition event/action 215 evaluates to a logical positive, meaning that the variable V_BACK 317 is greater than a constant V_CHG_MIN 327, then the microcontroller 109 performs the actions described in the event/action 215, setting the variable BAD_CHG_TIMER 301 to the value of a constant MIN_CHARGE_TEST_TIME 325, preferably 30 seconds. If the event portion of the state transition event/action 215 evaluates to a logical negative, meaning that the variable V_BACK 317 is not greater than a constant V_CHG_MIN 327, preferably 4.97 volts, then the microcontroller 109 does not perform the actions described in the event/action 215 during the transition T7 213. As long as the event portion of the state transition event/action 215 evaluates to a logical negative the microcontroller 109 will decrement variable BAD_CHG_TIMER 301 once per second until it reaches zero. When the BAD_CHG_TIMER 301 reaches zero this creates a condition TIMEOUT 303 which causes the microcontroller 109 to evaluate the event portion of event/action 217 as a logical positive, meaning that a backup battery 105 short circuit condition has been detected. During a state transition T4 219 from the state CHARGE BACKUP BATTERY 202 to the state RUN OFF VEHICLE BATTERY 201 the microcontroller 109 sets the variable BAD_CHG_TIMER 301 to a constant BAD_CHARGE_DELAY 333, preferably 43,200 seconds, and sets the control signal CHARGE_CTL 122/311 to false, opening current limited switch 121, shutting off current flow through current path 117. In order for the security module 101 to subsequently charge the backup battery 105 after detection of a short circuited battery, variable BAD_CHG_TIMER must achieve the condition TIMEOUT 303 which is necessary but not sufficient to force the state transition T2 209 from the state RUN OFF VEHICLE BATTERY 201 to the state CHARGE BACKUP BATTERY 202.

In a state transition T3 221 the event portion of a state transition event/action 223 provides a method for detecting and aborting the charging of the backup battery 105 when the variable V_SYS 313 is greater than a constant V_SYS_MAX 331, preferably 15.48 volts.

FIG. 3 is a chart illustrating variable and constant definitions corresponding to variables and constants found in the state diagram of FIG. 2. Of note are the variable V_SYS 313 which is derived from the scaled analog signal V_SYS_INST 141, averaged with preferably a 1 second time constant as shown in 403/405. The variable V_SYS_AVG 305 is derived by averaging the variable V_SYS 313 using a long time constant, preferably 12 hours. The variable V_SYS 313 is "instantaneous" as compared with the long term average variable V_SYS_AVG 305. If the short-term average variable V_SYS 313 is at least a constant value OFF2ON_DELTA 329 preferably 0.51 volts greater than the long term average variable V_SYS_AVG 305, then the charging system 107 is determined to be active, and charging of the backup battery 105 can proceed per the rules of the state diagram FIG. 2.

Figure 4:
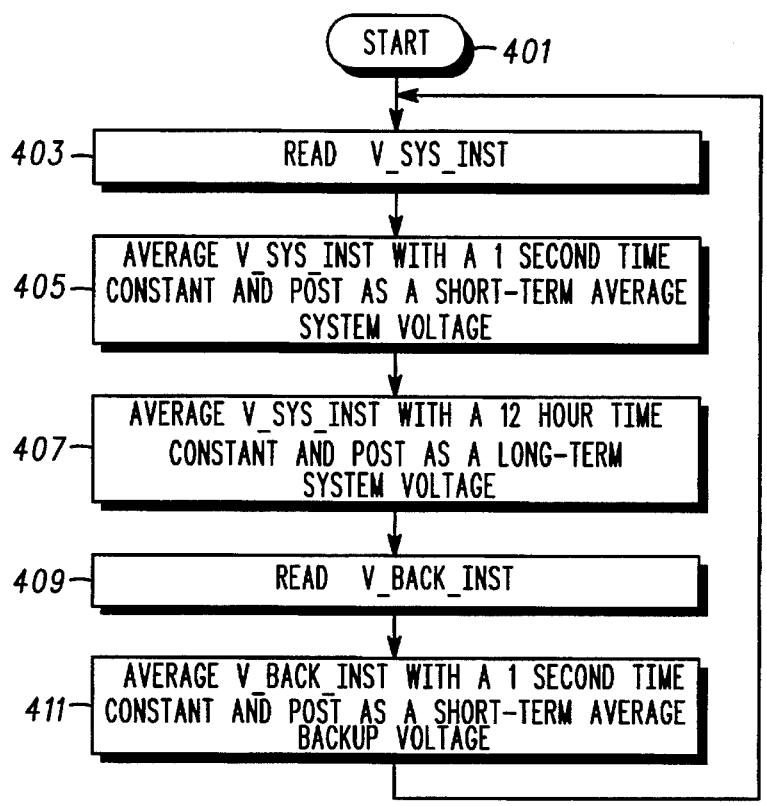
FIG. 4 is a flow chart showing software averaging routines encoded into the apparatus shown in FIG. 1.

FIG. 4 is a flow chart showing a software averaging routine 400 encoded into the apparatus shown in FIG. 1. The averaging routine 400 begins with an entry step 401. Execution proceeds from the entry step 401 to a process 403 in which the microcontroller 109 reads a digital representation of the analog value V_SYS_INST 141 as presented to analog input 143.

Next, in step 405 V_SYS_INST is averaged with a 1 second time constant filter and the resulting value is posted as a short-term average system voltage defined as the variable V_SYS 313.

Then, in step 407 the analog value V_SYS_INST 141 is further averaged with a 12 hour time constant filter and the resulting value is posted as a long-term system voltage defined as the variable V_SYS_AVG 305.

Next, in step 409 the microcontroller 109 reads a digital representation of the analog value V_BACK_INST 147 as presented to the analog input 149.

In step 411 V_BACK_INST 147 is averaged with a 1 second time constant filter and the resulting value is posted as a short-term average backup battery voltage defined as the variable V_BACK 317.

The software averaging routine 400 repeats itself starting at step 403, and runs periodically, preferably once each 10 mS. The posted values V_SYS 313, V_BACK 317, and V_SYS_AVG 305 are used to determine operating states of the security module 101 as described in the state diagram in FIG. 2.

Figure 5:
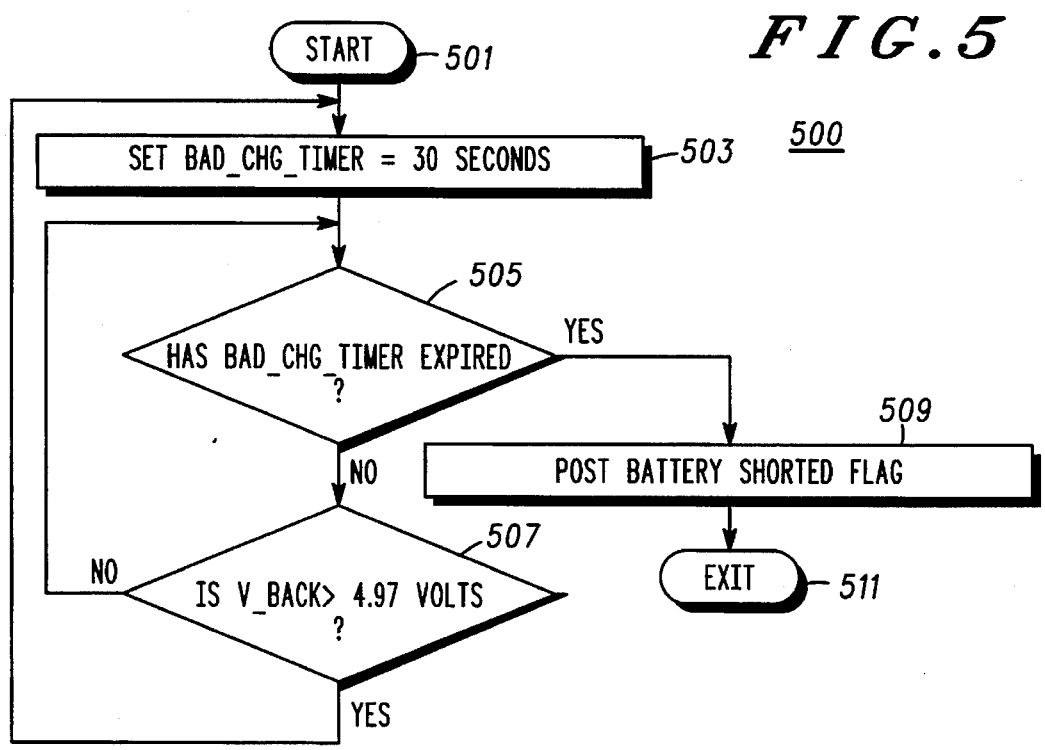
FIG. 5 is a flow chart showing a shorted battery detection routine encoded into the apparatus shown in FIG. 1.

FIG. 5 is a flow chart showing a shorted backup battery 105 detection routine 500 encoded into the apparatus shown in FIG. 1. The routine 500 executes while the security module 101 is operating in the state CHARGE BACKUP BATTERY 202. Execution of the routine 500 begins with an entry step 501.

At step 503 the variable BAD_CHG_TIMER 301 is set to 30 seconds, which is the preferred value for the constant MIN_CHARGE_TEST_TIME 325. The variable BAD_CHG_TIMER 301 is a module level timer which is decremented toward zero once each second as part of the operating system software encoded into security module 101. The variable BAD_CHG_TIMER 301 is considered to have "expired" when it has reached a value of zero. Execution proceeds from the process 503 to a decision step 505.

In step 505 the variable BAD_CHG_TIMER 301 is tested to see if it has "expired". If the variable BAD_CHG_TIMER 301 has "expired" then execution proceeds from the decision block 505 to the process 509 where a flag is posted indicating that a shorted backup battery 105 is detected, followed by execution of an exit step 511 which ends the execution of routine 500. If in decision block 505 the variable BAD_CHG_TIMER 301 has not "expired" then execution proceeds to decision block 507 where the variable V_BACK 317 is evaluated to see if it is greater than 4.97 volts, which is the preferred value for the constant V_CHG_MIN 327. If the variable V_BACK 317 is greater than 4.97 volts then execution proceeds back to process 503, otherwise execution proceeds back to decision block 505. Note that although a microcontroller and software based approach is illustrated here other, for example hardwired circuits and other, approaches which take advantage of the teaching described here will also yield the same benefits described in the preferred embodiment.

In conclusion, an improved backup battery management approach that has minimal external electrical interconnections—localized where possible, efficiently replenishes a backup battery only while an associated charging system is actively charging a vehicle battery, uses the backup battery to power a security system only while a vehicle's charging system and vehicle battery are incapable of doing so, and limits charging of the backup battery while the charging system is outputting too high a voltage or the backup battery is electrically shorted.

What is claimed is:

1. A backup battery management method having a backup battery and a charging system driving a vehicle battery, the method comprising the steps of:

averaging a voltage derived from the vehicle battery at a first rate and providing a short-term average system voltage in response thereto;

averaging the short-term average system voltage, at a second rate lesser than the first rate, and providing a long-term average voltage in response thereto; and charging the backup battery from the charging system while the short-term average system voltage exceeds the long-term average voltage by a predetermined threshold.

2. A method in accordance with claim 1 further comprising the step of:

establishing a first threshold; and charging the backup battery from the charging system while the short-term average system voltage exceeds the first threshold, established in the step of establishing a first threshold.

3. A method in accordance with claim 1 further comprising the step of:

establishing a second threshold; and stopping the charging of the backup battery from the charging system while the short-term average system voltage exceeds a second threshold, established in the step of establishing a second threshold.

4. A method in accordance with claim 1 further comprising the steps of:

determining if the backup battery is shorted; and stopping the charging of the backup battery from the charging system while the backup battery is shorted as determined in the step of determining if the backup battery is shorted.

5. A method in accordance with claim 4 wherein the step of determining if the backup battery is shorted comprises the steps of:

charging the backup battery for a predetermined time;

measuring a voltage of the backup battery;

posting a backup battery shorted flag when the voltage of the backup battery does not exceed a predetermined threshold.

6. A backup battery management apparatus having a backup battery and a charging system driving a vehicle battery, the apparatus comprising:

first averaging means for averaging a voltage derived from the vehicle battery at a first rate and providing a short-term average system voltage in response thereto;

second averaging means for averaging the short-term average system voltage, at a second rate lesser than the first rate, and providing a long-term average voltage in response thereto; and means for charging the backup battery from the charging system while the short-term average system voltage exceeds the long-term average voltage by a predetermined threshold.

7. A apparatus in accordance with claim 6 further comprising:

means for establishing a first threshold; and charging the backup battery from the charging system while the short-term average system voltage exceeds the first threshold.

8. A apparatus in accordance with claim 6 further comprising:

means for establishing a second threshold; and stopping the charging of the backup battery from the charging system while the short-term average system voltage exceeds the second threshold.

9. A apparatus in accordance with claim 6 further comprising:

means for determining if the backup battery is shorted; and means for stopping the charging of the backup battery from the charging system while the backup battery is shorted as determined by the means for determining.

\* \* \* \* \*